US012799580B2

(12) United States Patent
Ohno et al.

(10) Patent No.: US 12,799,580 B2
(45) Date of Patent: Nov. 17, 2026

(54) COMPOSITE PVD TARGETS

(71) Applicant: Applied Materials, Inc., Santa Clara, CA (US)

(72) Inventors: Kenichi Ohno, Sunnyvale, CA (US); Takashi Kuratomi, San Jose, CA (US); Ludovic Godet, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/099,277

(22) Filed: Jan. 20, 2023

(65) Prior Publication Data

US 2023/0235447 A1 Jul. 27, 2023

Related U.S. Application Data

(60) Provisional application No. 63/301,939, filed on Jan. 21, 2022.

(51) Int. Cl.
*C23C 14/34* (2006.01)
*C23C 14/50* (2006.01)
*H01J 37/34* (2006.01)

(52) U.S. Cl.
CPC .......... *C23C 14/3414* (2013.01); *C23C 14/50* (2013.01); *H01J 37/3423* (2013.01); *H01J 37/3429* (2013.01)

(58) Field of Classification Search
CPC .. C23C 14/3414; C23C 14/50; H01J 37/3423; H01J 37/3429
USPC ............................ 204/298.12, 298.2, 298.13
See application file for complete search history.

(56) References Cited

U.S. PATENT DOCUMENTS 4,444,635 A * 4/1984 Kobayashi .......... H01J 37/3408 204/192.15
4,468,313 A * 8/1984 Okumura ............ H01J 37/3429 204/192.15
5,827,414 A * 10/1998 Westwood .......... C23C 14/3407 204/192.2
6,342,131 B1 * 1/2002 Sardesai ................. C23C 14/35 204/192.15
6,464,844 B1 10/2002 Pichulo et al.
8,338,002 B2 12/2012 Hommura et al.
(Continued)

FOREIGN PATENT DOCUMENTS

CN 106342099 B 6/2011
CN 102586744 A 7/2012
(Continued)

OTHER PUBLICATIONS

Machine Translaton JP 01-136969 (Year: 1989).*
(Continued)

*Primary Examiner* — Rodney G Mcdonald
(74) *Attorney, Agent, or Firm* — Patterson + Sheridan, LLP

(57) ABSTRACT

Embodiments of the present disclosure generally relate to composite PVD target. The target has a diameter, a connection face, a substrate face opposite the connection face, a thickness between the connection face and the substrate face, and a material distribution. The material distribution includes a silicon containing material arranged in a pattern, and a titanium containing material arranged in the pattern. The material distribution is uniform at any point along the thickness.

18 Claims, 2 Drawing Sheets

(56) References Cited

U.S. PATENT DOCUMENTS

| | | | | |
|---|---|---|---|---|
| 2006/0219546 A1* | 10/2006 | Jan | C23C 14/3414 | |
| | | | 204/192.1 | |
| 2007/0193881 A1* | 8/2007 | Inagawa | H01J 37/3435 | |
| | | | 204/298.16 | |
| 2017/0178875 A1* | 6/2017 | Kohari | H01J 37/3426 | |

FOREIGN PATENT DOCUMENTS

| | | | |
|---|---|---|---|
| EP | 0618306 A2 | | 10/1994 |
| EP | 0 866 499 A2 | * | 9/1998 |
| JP | S59-179783 | * | 10/1984 |
| JP | S59179783 A | | 10/1984 |
| JP | 61-34509 | * | 8/1986 |
| JP | 01-136969 | * | 5/1989 |
| JP | 02-274873 | * | 11/1990 |
| JP | H05117848 A | | 5/1993 |

OTHER PUBLICATIONS

Machine Translation JP 02-274873 (Year: 1990).*
Machine Translation JP 61-34509 (Year: 1986).*
Machine Translation JPS 59-179783 (Year: 1984).*
International Search Report and Written Opinion for International Application No. PCT/US2023/011031 dated May 2, 2023.
Taiwanese Office Action for Application No. 112102716 dated Jul. 3, 2026.

* cited by examiner

COMPOSITE PVD TARGETS

CROSS-REFERENCE TO RELATED APPLICATIONS

This application claims benefit of U.S. Provisional Patent Application No. 63/301,939, filed on Jan. 21, 2022, the entirety of which is herein incorporated by reference.

BACKGROUND

Field

Embodiments of the present disclosure generally relate to composite physical vapor deposition (PVD) targets. More specifically, embodiments described herein relate to titanium and silicon PVD composite targets.

Description of the Related Art

Ternary films are conventionally deposited using multi-cathode (MC) chambers, in which two targets of different composition are utilized. In a MC chamber, power is alternated between the two or more material targets in order to tune the amount of target material sputtered from each target to form a film on a substrate, e.g., TiSiO. However, MC chambers suffer from slow deposition rates. In addition, careful tuning of the power for each target is needed to maintain a predetermined composition profile in the as-deposited material.

To drive down manufacturing costs, integrated chip (IC) manufacturers demand higher throughput and higher yield from every substrate processed. To increase production, large diameter physical vapor deposition (PVD) targets are preferred. MC chambers are used because two PVD target can be utilized, but the two targets are smaller to fit within the chamber. The smaller targets limit the deposition rates and increase production time and costs.

$Ti_xSi_yO_z$ materials have various optical applications due to the material's refractive index (RI) tunability based on the specific $Ti_xSi_yO_z$ composition while maintaining reduced optical loss. Previous methods of $Ti_xSi_yO_z$ material deposition in multi-cathode chambers alternated between one or more targets of either Ti or Si in order to achieve the desired $Ti_xSi_yO_z$ composition. Since these conventional targets are smaller to accommodate multiple targets in the MC chamber, the deposition rate was lower and the amount of power utilized was finely tuned in order to achieve desired predetermined composition of $Ti_xSi_yO_z$ film on the substrate. However, as previously discussed, various limitations of MC chambers hamper the efficiency by which $Ti_xSi_yO_z$ materials can be deposited.

Thus, what is needed in the art is improved apparatus and methods for depositing materials via physical vapor deposition.

SUMMARY

Composite PVD targets are described herein that include at least two materials and have various patterns on the target face. These improved targets enable multi cathode style processes without the need for two or more separate targets.

In one embodiment, a composite PVD target is provided. The target includes a diameter, a connection face, a substrate face disposed opposite the connection face, a thickness between the connection face and the substrate face, and a material distribution. The material distribution includes a silicon containing material and a titanium containing material arranged in the pattern. The material distribution is uniform at any point along the thickness.

In another embodiment, a composite PVD target assembly is provided. The target assembly includes a backing plate and a composite PVD target coupled to a target face of the backing plate. The composite PVD target includes a diameter of at least about 200 mm, a connection face coupled to the backing plate, a substrate face disposed opposite the connection face, a silicon containing material arranged in a first pattern, and a titanium containing material arranged in a second pattern.

In yet another embodiment, a PVD chamber is provided. The PVD chamber includes a chamber body, a substrate support disposed within the chamber body configured to support a substrate, a composite PVD target assembly disposed within the chamber body on an upper side of the chamber body, and the target assembly is connected to power source. The composite PVD target assembly includes a backing plate and a composite PVD target coupled to a target side of the backing plate. The composite PVD target includes a diameter, a connection face coupled to the backing plate, a substrate face disposed opposite the connection face, a thickness defined by the connection face of the PVD target and the substrate face of the PVD target, and a material distribution. The material distribution includes an annular pattern, a sector pattern, or a random pattern. The material distribution also includes a silicon containing material and a titanium containing material. The silicon containing material and the titanium containing material are uniform at any point along the thickness. The PVD chamber also includes a process volume disposed between a substrate support and the composite PVD target, where the process volume is configured to hold a plasma, and the substrate support is configured to support a substrate. The PVD chamber also includes a gas supply coupled to the chamber body configured to supply gas to the chamber.

BRIEF DESCRIPTION OF THE DRAWINGS

So that the manner in which the above recited features of the present disclosure can be understood in detail, a more particular description of the disclosure may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to composites targets for physical vapor deposition (PVD). More specifically, embodiments described herein relate to titanium (Ti) and silicon (Si) composite PVD targets.

Advantages of ternary TiSiO films deployed in optical applications include tuning optical refractive indexes (RIs) while maintaining low optical loss. Targets of the present application can be manufactured with a predetermined composition to achieve desired RIs and/or optical loss. Use of targets with a predetermined composition enables ternary films to be formed with a preselected composition more accurately than conventional approaches using multi-cathode systems.

Figure 1:
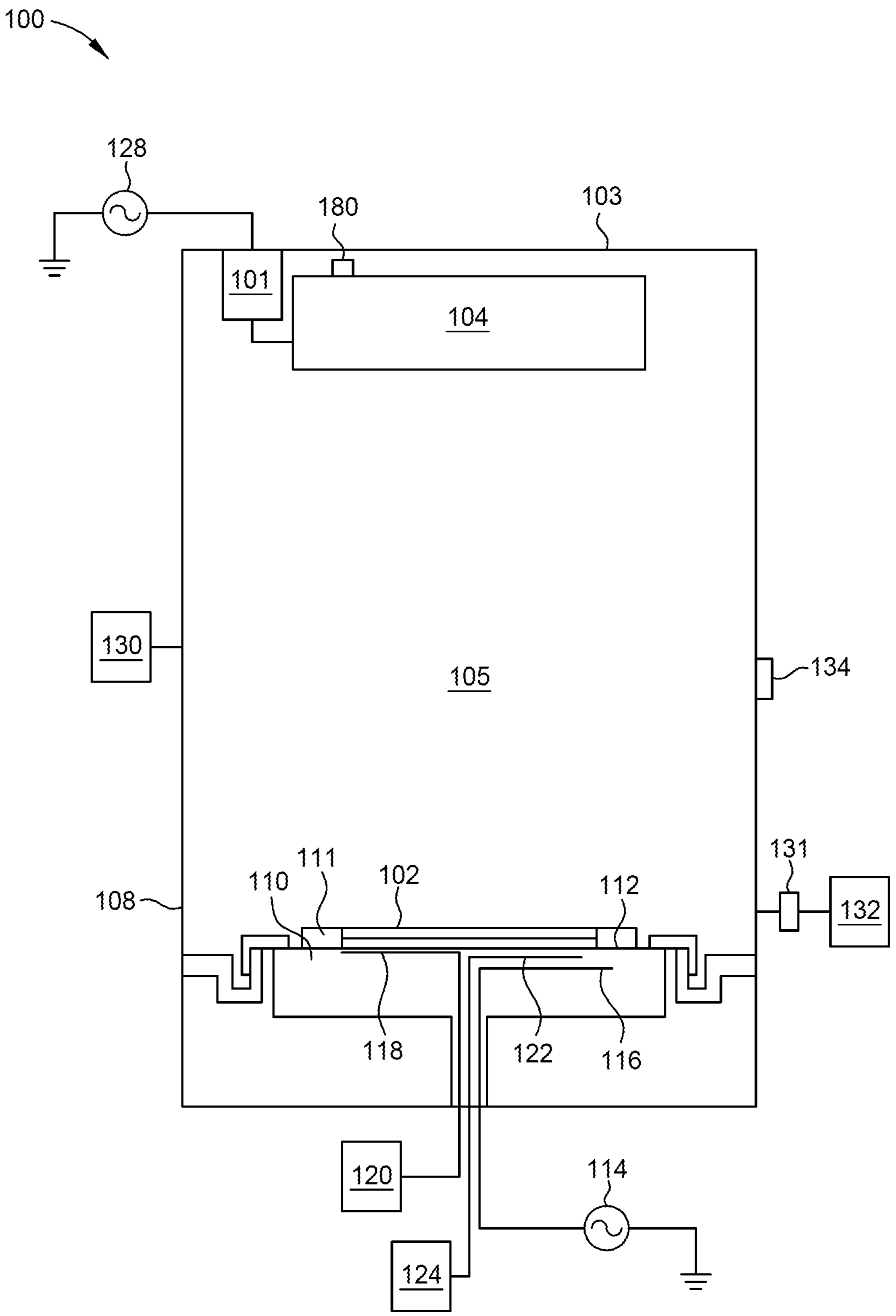
FIG. 1 is a schematic, cross-sectional view of a physical vapor deposition (PVD) process chamber, according to embodiments described herein.

FIG. 1 is a schematic, cross-sectional view of a physical vapor deposition (PVD) chamber 100 according to some embodiments. It is to be understood that the PVD chamber 100 described below is an exemplary PVD chamber and other PVD chambers, may be used with or modified to utilize the present disclosure.

In a PVD process performed in the PVD chamber 100, material layers or films are formed onto a substrate 102 by sputtering, such as reactive sputtering. The PVD chamber 100 includes a target assembly 104 and a substrate support 110 disposed opposite the target assembly 104. The target assembly 104 and substrate support 110 are disposed in a process volume 105 configured to receive one or more gases used to form a plasma therein. The PVD chamber 100 also includes a magnet 180. The magnet 180 is configured to be moveable across the side of the target assembly 104 opposite the process volume 105. As gas flows into the PVD chamber 100 and is ignited into a plasma. Once the plasma is formed, charged species from the plasma are accelerated toward the target assembly 104. The charged species collide with a target material to facilitate deposition of a film on a substrate 102 disposed on the substrate support 110 opposite the target assembly 104.

In one embodiment, the PVD chamber 100 is utilized to form film coatings for optical devices on a substrate 102. The PVD chamber 100 includes a substrate carrier 111 disposed on the substrate support 110 which holds the substrate 102. A target cathode 101 and the target assembly 104 and coupled to a body 108 of the PVD chamber 100. The target cathode 101 is connected to a power source 128 that provides power to the target assembly 104 and biases the target assembly 104 for PVD sputtering operations.

The substrate support 110 has a support surface 112 to support the substrate carrier 111 and the substrate 102. The PVD chamber 100 includes an opening 134 (e.g., a slit valve) in the body 108 through which the substrate 102 enters and exits the process volume 105 of the PVD chamber 100. The substrate support 110 includes an RF bias power source 114 coupled to a bias electrode 116 disposed in the substrate support 110. The PVD chamber 100 includes a gas source 136 that provides a sputter gas, such as argon (Ar), or nitrogen (N), combinations thereof, or other suitable sputter gasses (e.g. inert gases) to the process volume 105.

The substrate support 110 includes a cooling conduit 118 disposed therein. The cooling conduit 118 controllably cools the substrate support 110, the substrate carrier 111, and the substrate 102 positioned thereon to a predetermined temperature. The cooling conduit 118 is coupled to a cooling fluid source 120 which provides a fluid through the cooling conduit 118. The substrate support 110 also has a heater 122 embedded therein. The heater 122, such as a resistive element, is coupled to a heater power source 124 and controllably heats the substrate support 110 and the substrate 102 positioned thereon to a predetermined temperature.

The PVD chamber 100 also includes a gas supply 130 that supplies a process gas to the process volume 105 of the PVD chamber 100. For example, the gas supply 130 supplies oxygen-containing gas to the process volume 105 to form an oxidizing environment in the process volume 105. Other examples include the gas supply 130 also supplying a nitrogen-containing gas, an argon and oxygen containing gas, or an argon and nitrogen containing gas to the process volume 105. The PVD chamber 100 may also include a precursor gas source 132 to supply a precursor gas, for example a gaseous dopant precursor, which is controlled by a flow controller 131.

Figure 2:
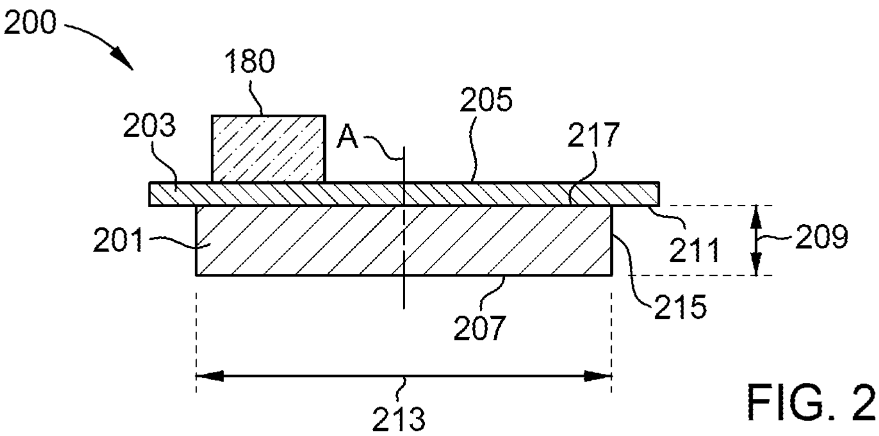
FIG. 2 is a schematic, cross-sectional view of a PVD target assembly, according to embodiments described herein.

FIG. 2 illustrates a target assembly 200. In one embodiment, the target assembly 200 is utilized as the target assembly 104 in the PVD chamber 100. The target assembly 200 includes a target 201 and a backing plate 203. The target 201 is coupled to the backing plate 203 on a connection face 211 of the backing plate 203 and a connection face 217 of the target 201. The backing plate 203 has a back face 205 opposite the connection face 211. The backing plate 203 is larger than the target 201, but the target 201 and backing plate 203 may be the same size. The backing plate 203 has a circular shape. Alternatively, other shapes are contemplated for the morphology of the backing plate 203, for example a square or a rectangle. In one embodiment which may be combined with other embodiments, the target 201 is a circular shape. Similar to the backing plate 203, other shapes are contemplated for the morphology of the target 201, for example a square or a rectangle.

The target 201 includes a substrate face 207, the connection face 217, a thickness 209, an outer surface 215, and an outer diameter 213. A vertical axis A extends in a direction perpendicular to a major axis of the target 201. The outer diameter 213 is between about 100 mm and about 600 mm, for example, between about 200 mm and 400 mm. The outer diameter 213 has a correlation or relation to a substrate diameter (not shown). For example, the outer diameter 213 may be at least about equal to the substrate diameter. In another example, the outer diameter 213 is greater than the substrate diameter. The substrate face 207 is a substantially planar surface, but may have surface textures or contours in other embodiments. The thickness 209 of target 201 is defined by the distance between the substrate face 207 and the connection face 217. The target 201 is a composite material fabricated of at least two different materials. In one embodiment which may be combined with other embodiments, a silicon (Si) material and a titanium (Ti) material are utilized to form the target 201. The target 201 is substantially uniform across the thickness 209. The target 201 also includes one or more patterns on the substrate face 207.

The target 201 is a composite PVD target of at least a TiSi material. The TiSi composite target is represented as $Ti_xSi_y$, where x is the concentration (or relative amount per unit volume) of Ti and y is the concentration (or relative amount per unit volume) of Si. The amounts of x and y in the composite are predetermined and premixed with x+y=100% of the composition of the composite (neglecting impurities and dopants). By predetermining the composition of the composite material, adjustment of process parameters to achieve a predetermined composition during the PVD process can be avoided, which increases throughput and reduces the probability of non-uniform material compositions being deposited on a substrate. In some embodiments which can be combined with other embodiments, x is between 0% and 75% of the composite (thus, y is between 25% and 100%). In other embodiments, x is between 0% and 10% (y between 90% and 100%), x is between 10% and 20% (y is between 80% and 90%), x is between 20% and 30% (y is between 70% and 80%), x is between 30% and 40% (y is between 60% and 70%), x is between 40% and 50% (y is between 50% and 60%), x is between 50% and 60% (y is between 40% and 50%), or x is between 60% and 75% (y is between 25% and 40%). The composition percentages can be by mass, volume, or surface area. The amounts of Ti and Si in the TiSi composite affects the composition of the TiSiO film that is deposited on the substrate. In one example, a higher Ti concentration in the composite would result in a greater amount of Ti in the deposited TiSi film.

The target 201 is circularly shaped and has a diameter of greater than 400 mm for the processing of a substrate of a diameter greater than 300 mm. However, it is contemplated that the target 201 may be greater than 300 mm, or greater than 200 mm, or greater than 100 mm, or greater than 50 mm, or greater than 10 mm. A larger target has a larger area for plasma exposure, which increases the deposition rate and increases throughput of the composite PVD film deposition process.

In other embodiments, the target 201 includes composite materials other than TiSi. For example, composites such as niobium-silicon (NbSi) or titanium-niobium (TiNb) are also contemplated by this disclosure for use in PVD processes. For such composites, ratios similar to those for TiSi described above are contemplated.

FIG. 2 further illustrates the magnet 180 disposed on the back face 205 of the backing plate 203 opposite the target 201. The magnet 180 is configured to be moveable across the entirety of the backing plate 203. The plasma characteristics can be controlled or influenced by the location of the magnet 180 to concentrate the plasma to a desired region of the target 201 by positioning the magnet 180 in a desired position on the back face 205 of the backing plate 203. For example, if a higher concentration of Si than Ti is desired, the magnet 180 may be positioned in relation to an area of the target 201 that has a higher Si concentration. As the magnet 180 is moved from a Si region toward a Ti region, the concentration begins to shift in favor of Ti sputtering because the magnet 180 influences the plasma distribution about the face 207 of the target 201. In some embodiments, when the magnet 180 is placed at the border of the Si/Ti regions, the concentration of Ti to Si is approximately 1:1. This enables control of the compositions being deposited throughout the PVD process. Multiple magnets are also contemplated. The film deposition characteristics can also be controlled by utilizing different patterns of material distributions 300 on the substrate face 207, which are described in greater detail below.

Figure 3A:
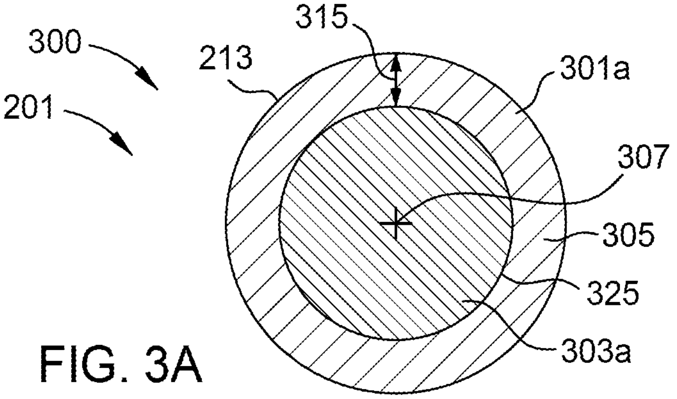
FIG. 3A illustrates an annular TiSi target pattern, according to embodiments described herein.
Figure 3B:
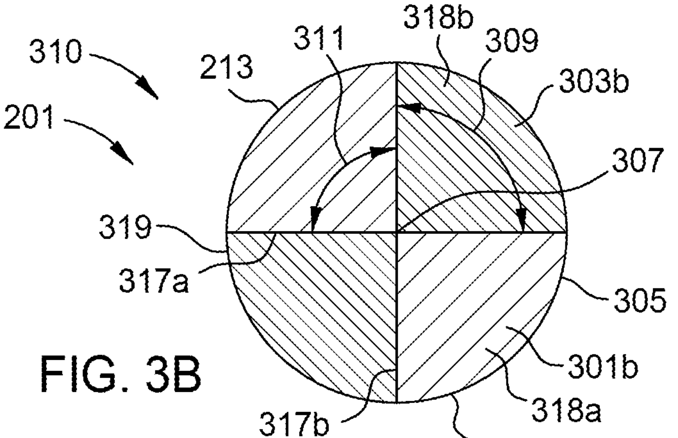
FIG. 3B illustrates a sector TiSi target pattern, according to embodiments described herein.
Figure 3C:
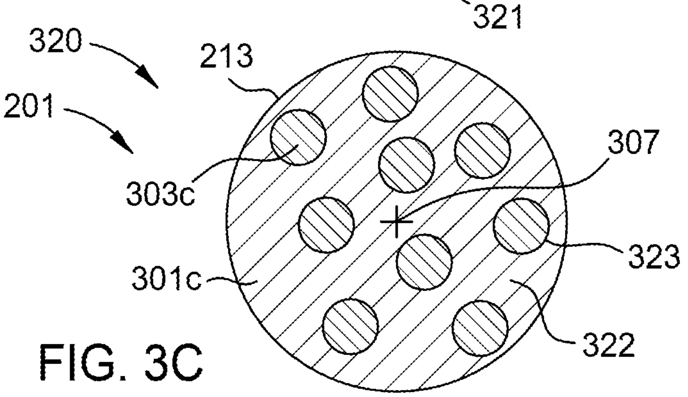
FIG. 3C illustrates a distributed TiSi target pattern, according to embodiments described herein.

FIGS. 3A, 3B, and 3C illustrate different embodiments of the patterns of material distributions 300, 310, 320, respectively, of the target 201. The material distributions 300, 310, 320 of the target 201 include a first target material 301, a second target material 303, a center 307, and an outer diameter 213 of the target 201. The first target material 301 may be Si, but may also be Ti. The second target material 303 may be Si, but may also be Ti. Other materials for the first and second target material 301, 303 are also contemplated. The first target material 301 and second target material 303 are uniform along the thickness 209 of the target 201. However, non-uniform thicknesses across the target 201 are also contemplated. In some embodiments, the first target material 301 and second target material 303 may be Nb.

FIG. 3A illustrates an example of the material distribution 300 having an annular pattern. The annular pattern includes a center circle 325 of a second material 303*a* with an annulus 305 of first material 301*a*. A diameter of the center circle 325 is between about 10 mm and about 450 mm. The annulus 305 includes a thickness 315. The thickness 315 of the annulus 305 is the distance between the diameter of the center circle 325 and the outer diameter 213 of the target 201. The thickness 315 may be between about 10 mm and about 250 mm. Additional annuluses alternating between the first material 301*a* and second material 303*a* are also contemplated. For example, a center circle 325 of the first material 301*a* is surrounded by a first annulus 305 of second material 303*a*. The first annulus 305 is then surrounded by a second annulus (not shown) of first material 301*a*. The annulus 305 or alternating annuluses each have an annular thickness 315. The annular thickness 315 may be equal for each subsequent annulus or may vary based on the process requirements.

FIG. 3B illustrates an example of the material distribution 310 having a sector pattern. The sector pattern includes a plurality of sectors 318. The plurality of sectors 318 includes a plurality of first material sectors 318*a* and a plurality of second material sectors 318*b*. Each of the first material sectors 318*a* includes the first material 301*b* and are defined by a first radius 317*a*, a second radius 317*b*, a first material sector angle 311 between the radii 317*a*, 317*b*, and a first material arc 321 along the outer diameter 213. Each of the second material sectors 318*b* includes the second material 303*b* and are defined by a first radius 317*a*, a second radius 317*b*, a second material sector angle 309 between the radii 317*a*, 317*b*, and a second material arc 319 along the outer diameter 213. The first radius 317*a* and the second radius 317*b* each extend from the center 307 of the target 201 to the outer diameter 213. The first material sector angles 311 and the second material sector angle 309 may each be in the range between about 1° to about 359°, for example about 10° to about 180°, such as about 90°. The plurality of first material sectors 301*b* and the plurality of second material sectors 318*b* alternate around the target center 307. When the sector angles 309, 311 are combined, equal 360°. The first material sector angles 311 and the second material sector angles 309 may be equal to each other or varied. FIG. 3B illustrates a four sector or quadrant embodiment with equal first material sector angles 311 and the second material sector angles 309, but embodiments with at least two, three, six, eight, and ten or more sectors are also contemplated.

As shown in the embodiment of FIG. 3B, the target 201 has four sectors 318 within the outer diameter 213 of the target 201. The sector angles 309, 311 are 90° and sectors 318*a*, 318*b* alternate about the center 307. The first material sector 318*a* is defined by the first radius 317*a*, the second radius 317*b*, the first material sector angle 311 between the radii 317*a*, 317*b*, and the first material arc 321. The second material sector 318*b* is defined by the first radius 317*a*, the second radius 317*b*, the second material sector angle 309 between the radii 317*a*, 317*b*, and the second material arc 319. The first material 301*b* of the first material sector 318*a* is a Si containing material (e.g., silicon) and the second material 303*b* of the second material sector 318*b* is a Ti containing material (e.g., titanium). Further, in other embodiments the materials 301*b*, 303*b* may also be Nb or other target material.

FIG. 3C illustrates an example of a material distribution 320 having a distributed pattern, according to some embodiments. The target 201 has a target area 322 of the target face 207, a first material section 301*c* and a plurality of second material sections 303*c* within the first material section 301*c*. The target area 322 is defined by the outer diameter 213. In some embodiments the first material section 301*c* occupies more of the target area 322 than the second material sections 303*c*. The target area 322 includes a ratio between a total area of the first material section 301*c* and a total area of the second material section 303*c*. The ratio is determined by comparing the percentage of the target area 322 from the first material section 301*c* surface area to the second material section 303*c* surface area. For example, the target area 322 may include between about 10% and 90% first material section 301*c* and between about 10% and 90% second material section 303*c*. In another example, the percentages of the target area 322 may include between about 10% and about 50% first material section 301*c* and between about 10% and about 50% second material section 303*c*. In some embodiments the percentages of the target area 322 may be about 70% first material section 301*c* and about 30% second material section 303*c*. Still further, the percentages of the target area 322 may be about 30% first material section 301*c* and about 70% second material section 303*c*. Additionally, the percentages of the target area 322 may be about 50% first material section 301*c* and about 50% second material section 303*c*. The percentage of the first material section 301*c* and second material section 303*c* should equal about 100% but lower percentages are contemplated to account for dopants and impurities in the target 201. The surface area ratio is adjustable to produce predetermined characteristics within the process volume 105 and film characteristics on the substrate 102.

As illustrated in FIG. 3C, the plurality of second material sections 303*c* are cylindrical section within the first material section 301*c*, but the sections 303*c* may also be, squared, triangular, squamous, or other shapes. The plurality of second material sections 303*c* may be in a pattern, a pattern offset from the center 307, or any other geometric or non-geometric arrangement. The plurality of second material sections 303*c* are randomly distributed throughout the first material section 301*c*. The sections 301*c*, 303*c* are uniform along the thickness 209. The second material sections 303*c* may also be a single section.

The embodiment of FIG. 3C illustrates an example where the first material section 301*c* fills most of the target area 322 and a plurality of second material sections 303*c* are circles within the first material section 301*c*. Specifically, there are nine second material sections 303*c* distributed across the target area 322. The nine circular second material sections 303*c* are defined by a sub diameter 323. The sub diameter 323 is between about 1 mm to about 100 mm, for example in the range between about 20 mm to about 50 mm. It is to be noted, however, that more or less than material sections 303*c* are contemplated.

While the foregoing is directed to embodiments of the present disclosure, other and further embodiments of the disclosure may be devised without departing from the basic scope thereof, and the scope thereof is determined by the claims that follow.

What is claimed is:

1. A composite PVD target assembly comprising:
- a backing plate having a back face and a connection face opposing the back face;
- a magnet disposed on the back face, wherein the magnet is configured to be movable across the backing plate; and
- a composite PVD target coupled to the connection face of the backing plate, wherein the composite PVD target comprises:
  - a diameter greater than 400 mm;
  - a connection face;
  - a substrate face disposed opposite the connection face;
  - a thickness between the connection face and the substrate face; and
  - a material distribution comprising:
    - a silicon containing material arranged in an annular pattern, wherein the silicon containing material comprises between 20% and 50% of a total volume of the material distribution; and
    - a titanium containing material arranged in the annular pattern, wherein the titanium containing material comprises between 50% and 80% of the total volume of the material distribution, and wherein the material distribution is uniform at any point along the thickness.

2. The composite PVD target of claim 1, wherein the annular pattern comprises:
- the silicon containing material arranged as a circle; and
- the titanium containing material arranged as an annulus.

3. The composite PVD target of claim 2, wherein the annular pattern further comprises:
- the silicon containing material arranged as an additional annulus disposed around the titanium containing material arranged as the annulus.

4. The composite PVD target of claim 1, wherein the annular pattern comprises:
- the titanium containing material arranged as a circle; and
- the silicon containing material arranged as an annulus.

5. The composite PVD target of claim 4, wherein the annular pattern further comprises:
- the titanium containing material arranged as an additional annulus disposed around the silicon containing material arranged as the annulus.

6. The composite PVD target of claim 1, wherein the material distribution comprises more of the titanium containing material than the silicon containing material.

7. The composite PVD target of claim 1, wherein the diameter of the target is configured to be greater than a substrate diameter.

8. A composite PVD target assembly, comprising:
- a backing plate having a back face and a connection face opposing the back face;
- a magnet disposed on the back face, wherein the magnet is configured to be movable across the entirety of the backing plate; and
- a composite PVD target coupled to the connection face of the backing plate,
- wherein the composite PVD target comprises:
  - a diameter greater than 400 mm;
  - a connection face coupled to the backing plate;
  - a substrate face disposed opposite the connection face;
  - a silicon containing material arranged in a first annular pattern, wherein the silicon containing material comprises between 20% and 50% of a total volume of the material distribution; and
  - a titanium containing material arranged in a second annular pattern, wherein the titanium containing material comprises between 50% and 80% of the total volume of the material distribution.

9. The composite PVD target assembly of claim 8, wherein a material distribution is uniform at any point between the substrate face and the connection face.

10. The composite PVD target assembly of claim 8, wherein:
- the first annular pattern comprises the silicon containing material arranged as a circle; and the second annular pattern comprises the titanium containing material arranged as an annulus.

11. The composite PVD target of claim 10, wherein the silicon containing material is further arranged in a third annular pattern comprising an annulus.

12. The composite PVD target assembly of claim 8, wherein:

the second annular pattern comprises the titanium containing material arranged as a circle; and the first annular pattern comprises the silicon containing material arranged as an annulus.

13. The composite PVD target of claim 12, wherein the titanium containing material is further arranged in a third annular pattern comprising an annulus.

14. The composite PVD target assembly of claim 8, wherein the diameter is configured to be greater than a substrate diameter.

15. The composite PVD target assembly of claim 8, wherein the diameter is configured to be about equal to a substrate diameter.

16. A PVD chamber comprising:

a chamber body;

a substrate support disposed within the chamber body configured to support a substrate;

a process volume disposed between the substrate support and the chamber body, wherein the process volume is configured to hold a plasma; and the substrate support is configured to support a substrate;

a gas supply coupled to the chamber body configured to supply a gas;

a composite PVD target assembly disposed within the chamber body, on a upper side of the chamber body, connected to a power source, wherein the composite PVD target assembly comprises:

a backing plate having a back face and a connection face opposing the back face;

a magnet disposed on the back face, wherein the magnet is configured to be movable across the backing plate; and a composite PVD target coupled to the connection face of the backing plate, wherein the composite PVD target comprises:

a diameter greater than 400 mm;

a connection face coupled to the backing plate;

a substrate face disposed opposite the connection face;

a thickness defined by the connection face of the composite PVD target and the substrate face of the composite PVD target; and a material distribution comprising:

a pattern, wherein the pattern is an annular pattern;

a silicon containing material arranged in the annular pattern, wherein the silicon containing material comprises between 20% and 50% of a total volume of the material distribution; and a titanium containing material arranged in the annular pattern, wherein the titanium containing material comprises between 50% and 80% of the total volume of the material distribution, and wherein the silicon containing material and the titanium containing material are uniform at any point along the thickness.

17. The composite PVD target of claim 16, wherein the annular pattern comprises:

one of the silicon containing material or the titanium containing material arranged as a circle; and the other one of the silicon containing material or the titanium containing material arranged as a first annulus around the circle.

18. The composite PVD target of claim 17, wherein the annular pattern further comprises:

the one of the silicon containing material or the titanium containing material arranged as a second annulus around the first annulus.

* * * * *